(12) United States Patent
Matsushita et al.

(10) Patent No.: US 9,837,374 B2
(45) Date of Patent: Dec. 5, 2017

(54) METHOD OF MANUFACTURING A DEVICE

(71) Applicant: KYOCERA Corporation, Kyoto-shi, Kyoto (JP)

(72) Inventors: Hideki Matsushita, Kyoto (JP); Masanobu Kitada, Kyoto (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 300 days.

(21) Appl. No.: 14/425,407

(22) PCT Filed: Sep. 9, 2013

(86) PCT No.: PCT/JP2013/074256
§ 371 (c)(1),
(2) Date: Mar. 3, 2015

(87) PCT Pub. No.: WO2014/038693
PCT Pub. Date: Mar. 13, 2014

(65) Prior Publication Data
US 2015/0206853 A1 Jul. 23, 2015

(30) Foreign Application Priority Data
Sep. 7, 2012 (JP) ................ 2012-196886

(51) Int. Cl.
*B32B 38/00* (2006.01)
*H01L 23/00* (2006.01)
(Continued)

(52) U.S. Cl.
CPC .............. *H01L 24/83* (2013.01); *B32B 37/18* (2013.01); *B32B 37/24* (2013.01);
(Continued)

(58) Field of Classification Search
CPC ..... H01L 24/83; H01L 21/2007; B32B 37/18; B32B 37/24; B32B 38/0008; B32B 38/0036; C23C 14/18; C23C 14/46
See application file for complete search history.

(56) References Cited

U.S. PATENT DOCUMENTS

2004/0235266 A1* 11/2004 Tong ................ B81C 1/00357
438/455
2010/0000663 A1* 1/2010 Goto ..................... B23K 20/02
156/151
2011/0214816 A1 9/2011 Goto et al.

FOREIGN PATENT DOCUMENTS

EP 2058080 A1 5/2009
JP 10-092702 A 4/1998
(Continued)

OTHER PUBLICATIONS

International Search Report, PCT/JP2013/074256, dated Dec. 10, 2013, 2 pgs.
(Continued)

*Primary Examiner* — Daniel McNally
(74) *Attorney, Agent, or Firm* — Volpe and Koenig, P.C.

(57) ABSTRACT

Provided is a device in which the metal content existing in a joining interface is controlled. A manufacturing method for the device comprises: a step in which the surfaces of a first substrate and a second substrate are activated using a FAB gun; a step in which a plurality of metals are discharged by using the FAB gun to sputter a discharged metal body comprising the plurality of metals, and the plurality of metals are affixed to the surfaces of the first substrate and the second substrate; a step in which the first substrate and the second substrate are joined at room temperature; and a step in which heating is performed at a temperature that is high in comparison to the agglomeration start temperature of the plurality of metals and of the elements that constitute the
(Continued)

first substrate or the second substrate. With regards to the step in which the plurality of metals are affixed, the density of the plurality of metals existing on the joining interface of the first substrate and the second substrate is set to $1\times10^{12}/$ cm$^2$ or less by adjusting the exposure area of the discharged metal body.

11 Claims, 9 Drawing Sheets

(51) Int. Cl.
    *C23C 14/18*      (2006.01)
    *C23C 14/46*      (2006.01)
    *B32B 37/18*      (2006.01)
    *B32B 37/24*      (2006.01)
    *H01L 21/20*      (2006.01)

(52) U.S. Cl.
CPC ...... *B32B 38/0008* (2013.01); *B32B 38/0036* (2013.01); *C23C 14/18* (2013.01); *C23C 14/46* (2013.01); *H01L 21/2007* (2013.01); *B32B 2037/243* (2013.01); *B32B 2305/30* (2013.01); *B32B 2310/14* (2013.01); *B32B 2311/00* (2013.01); *B32B 2313/00* (2013.01); *B32B 2457/14* (2013.01); *H01L 2924/365* (2013.01)

(56) References Cited

FOREIGN PATENT DOCUMENTS

| JP | 2004337927 A | * | 12/2004 |
|----|--------------|---|---------|
| JP | 2007-281203 A | | 10/2007 |
| JP | 2008-062267 A | | 3/2008 |

OTHER PUBLICATIONS

Extended European Search Report, European Patent Application No. 13835803.1, dated Jun. 13, 2016, 7 pgs.

* cited by examiner (a)

(b)

METHOD OF MANUFACTURING A DEVICE

TECHNICAL FIELD

The present invention relates to a method of manufacturing a device, with which two substrates are bonded by room-temperature bonding.

BACKGROUND ART

In recent years, studies have been conducted on the technology for manufacturing a device by bonding two types of substrates at room temperature. For example, Japanese Unexamined Patent Application Publication No. 10-092702 discloses a silicon wafer bonding method that does not require loading and pressing or a heat treatment but achieves a large bonding strength. This room-temperature silicon wafer bonding method includes bonding a silicon wafer to a silicon wafer, in which bonding surfaces of the two silicon wafers are sputter-etched by being irradiated with an inert gas ion beam or an inert gas fast atom beam in vacuum at room temperature prior to bonding.

SUMMARY OF INVENTION

However, the investigations conducted by the inventor of the present invention have revealed that metal materials mix into the bonding surface between the two substrates bonded through a technique described in Japanese Unexamined Patent Application Publication No. 10-092702. The presence of metal atoms constituting the metal materials may pose a problem depending on the properties of the substrates to be bonded. For example, in a case where a substrate has a semiconductor layer such as a substrate having a silicon-on-sapphire (SOS) structure and a semiconductor device is to be formed in the semiconductor layer, presence of metal atoms at the bonding interface or diffusion of metal atoms into the semiconductor layer may adversely affect operation of the semiconductor device.

The present invention has been conceived under the above-described circumstances and an object is to provide a method of manufacturing a device, in which diffusion of metals mixing into the bonding surface during bonding of the two substrates is suppressed.

An embodiment of a method of manufacturing a device according to the present invention includes an activating step, a step of attaching a plurality of metals, a bonding step, and a heating step. The activating step involves activating a surface of a first substrate and a surface of a second substrate by using a FAB gun. In the step of attaching the plurality of metals, a metal releasing member containing the plurality of metals is first sputtered by using the FAB gun and the plurality of metals are released. Next, the plurality of metals released attach to the surfaces of the first substrate and the second substrate. In the bonding step, a first surface activated of the first substrate and a second surface activated of the second substrate are brought into contact with each other so as to join the first substrate and the second substrate to each other at room temperature. In the heating step, heating is performed after the bonding of the first substrate and the second substrate, the heating being performed at a temperature higher than an agglomeration start temperature of the plural metals and elements constituting the first substrate or the second substrate. In the step of attaching the plurality of metals, an exposed area of the metal releasing member is adjusted and an existing density of the plurality of metals present at a bonding surface between the first substrate and the second substrate is thereby adjusted to $1 \times 10^{12}/cm^2$ or less.

According to the present invention, a method of manufacturing a device, with which mixing-in of metals into a bonding interface is suppressed, can be provided.

DESCRIPTION OF EMBODIMENTS

Figure 1:
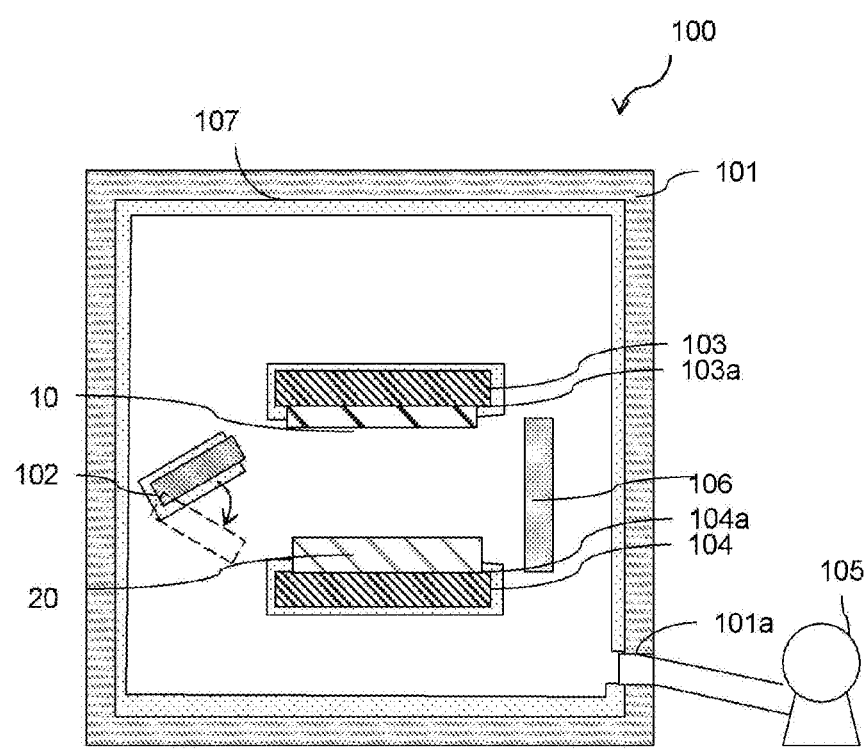
FIG. 1 is a schematic view of a room-temperature bonding device 100.

An example of an embodiment of a method of manufacturing a device according to the present invention will now be described with reference to the drawings.

A device 1 is formed by bonding a first substrate 10 and a second substrate 20 by causing the surfaces of the two substrates to make direct contact with each other. The plurality of metals 30 are attached to the surfaces of the first substrate 10 and the second substrate 20. Since the metals 30 are in small amounts and are attached to very small regions, the metals 30 are not illustrated in the drawings.

(Activating Step)

A room-temperature bonding device 100 illustrated in FIG. 1 is used to manufacture the device 1 according to this embodiment. The room-temperature bonding device 100 includes a vacuum chamber 101, a neutron beam (FAB) gun 102, a first stage 103, a second stage 104, a vacuum pump 105, and a metal releasing member 106. An exhaust 101a connected to the vacuum pump 105 is formed in the vacuum chamber 101. In this drawing, the first substrate 10 is held on the lower side of the first stage 103, the second substrate 20 is held on the upper side of the second stage 104, and the surface of the first substrate 10 faces the surface of the second substrate 20; however, the first stage 103 and the second stage 104 can be moved within the vacuum chamber 101 and a position adjusting mechanism not shown in the drawing is provided.

First, the surface of the first substrate 10 and the surface of the second substrate 20 are activated to form a first surface 10a and a second surface 20a not shown in the drawing. The room-temperature bonding device 100 shown in FIG. 1 is used to activate the surfaces of the two substrates 10 and 20. In this example, the first stage 103 is on the upper side, the second stage 104 is on the lower side, and the stages are arranged so as to face each other with a gap therebetween. The FAB gun 102 is on the side surface side of the first stage 103 and the second stage 104 and applies a neutron beam to the surface of the first substrate 10 held on the lower surface of the first stage 103 and to the surface of the second substrate 20 held on the upper surface of the second stage 104 while the FAB gun 102 is being turned by a position adjusting mechanism not shown in the drawing.

In order to maintain a high-vacuum atmosphere in the vacuum chamber 101, the vacuum chamber 101, a part of the FAB gun 102, the first stage 103, the second stage 104, and the position adjusting mechanism for the FAB gun 102, the first stage 103, and the second stage 104 are usually made of metal materials. Thus, in this embodiment, a cover member 107 that covers these components is provided. The cover member 107 is made of an insulating material and silicon oxide, silicon nitride, silicon carbide, or the like can be used, for example. The cover member 107 is preferably made of an insulating material that contains, as one of the main components, an element which is a main component of the first substrate 10 or an element which is a main component of the second substrate 20. Such an insulating material is resistant to etching by irradiation with neutron beams. In particular, when the insulating material is composed of an element which is a main component of the first substrate 10 or an element which is a main component of the second substrate 20, mixing-in of new impurities derived from foreign components can be suppressed. When the first substrate 10 or the second substrate 20 is composed of Si, silicon oxide is preferably used as the material constituting the cover member 107. This is to suppress contamination with new impurities derived from foreign components during formation of semiconductor functional units in a substrate composed of Si. This is also preferable from the viewpoint of workability.

By using the room-temperature bonding device 100, the first substrate 10 is held on the first stage 103 with the surface to be activated facing downward, the second substrate 20 is held on the second stage 104 with the surface to be activated facing upward, these main surfaces (surfaces) are activated by using the FAB gun 102, and the first surface 10a and the second surface 20b are formed.

The FAB gun 102 is used to activate the surfaces. Compared to an ion gun, the FAB gun 102 has higher directivity and higher energy. Because the FAB gun 102 has high directivity, the surfaces of the first substrate 10 and the second substrate 20 and the nearby regions thereof to be activated can be unfailingly irradiated. As a result, activation of other structural members in the vacuum chamber 101 can be suppressed. Moreover, due to high energy, the surfaces of the first substrate 10 and the second substrate 20 can be highly activated and thus the bonding force at the time the two surfaces are brought into contact with each other can be increased.

(Step of Attaching Metals)

In the room-temperature bonding device 100, the metal releasing member 106 is sputtered by using the FAB gun 102. The metal releasing member 106 contains the plurality of metals. Examples of the plurality of metals include iron (Fe), chromium (Cr), nickel (Ni), copper (Cu), and zinc (Zn). Here, the main component among the plurality of metals is to be a metal element other than the element which is a main component of the first substrate 10 and the element which is a main component of the second substrate 20. The metal releasing member 106 may be solely composed of a metal material containing the plurality of metals or may be constituted by a support composed of an insulating material such as a ceramic and a metal body composed of the plurality of metals disposed on the support.

The metal releasing member 106 irradiated by using the FAB gun 102 releases the plurality of metals in the vacuum chamber 101. The released plural metal atoms attach to the first surface 10a and the second surface 20b of the first substrate 10 and the second substrate 20. This step of attaching the metals may be performed separately from or simultaneously with the activating step described above.

The metal releasing member 106 may be disposed to face the FAB gun 102 and on the side surface side of the first substrate 10 and the second substrate 20 as shown in FIG. 1. Alternatively, a part of the first stage 103 and/or a part of the second stage 104 may function as the metal releasing member 106.

The amount of the plurality of metals supplied to the first surface 10a activated and the second surface 20b activated is determined by considering the concentration at the interface. For example, the plurality of metals may include Fe, Cr, and Ni and the amount of Fe discharged in the largest quantity may be $1.5 \times 10^5$ ng/cm$^3$. This amount can be adjusted by adjusting the area of the plurality of metals exposed in the metal releasing member 106 by using the cover member 107. In the case where a portion of the first stage 103 and/or a portion of the second stage 104 is to serve as the metal releasing member 106, the amount can be adjusted by controlling the areas of the first stage 103 and the second stage 104 exposing from the cover member 107.

The density of the plurality of metals at the interface between the first substrate 10 and the second substrate 20 can be controlled to $10^{12}$ atoms/cm$^2$ or less by controlling the amount of metals supplied. At such an existing density, the plurality of metals do not completely cover the first surface 10a of the first substrate 10 and the second surface 20b of the second substrate 20. In other words, the atomic arrangement of the atoms constituting the first surface 10a of the first substrate 10 and the second surface 20a of the second substrate 20 remains exposed.

The existing density of the plurality of metals refers to the number of atoms per unit surface area at the interface. Actually, a particular volume of a portion of the first substrate 10 on the second substrate 20 is dissolved in an etching solution, the amount of metal elements constituting the plurality of metals is measured by ICP-MS (Inductively Coupled Plasma Mass Spectrometry), and the density in the surface direction is calculated based on the assumption that all metal elements exist in the region within 5 nm from the interface in the thickness direction. This assumption is made by conducting observation and measurement of the metal element distribution state in the thickness direction on a plurality of devices obtained from this embodiment and is based on the finding that the atoms of the metal elements are present in the region within 5 nm between the first substrate 10 and the second substrate 20 even at a highest metal content and rarely diffuse into the first substrate 10.

The first surface 10a activated and second surface 20b activated before bonding may be measured by a total reflection X-ray fluorescence (TXRF), secondary ion mass spectroscopy (SIMS), or the like.

(Bonding Step)

The first surface 10a and the second surface 20b to which the plurality of metals have been supplied are brought into direct contact with each other and, as a result, the first substrate 10 and the second substrate 20 are bonded at room temperature.

(Heating Step)

Next, the first substrate 10 and the second substrate 20 bonded to each other are heated. The heating temperature is to be higher than the agglomeration start temperature of the plurality of metals and the elements constituting the first substrate 10 or the second substrate 20. While the agglomeration start temperature can be confirmed through diffusion coefficient, phase diagram, etc., the first substrate 10 or the second substrate 20 may not be able to be treated as a bulk body depending on the thickness and the agglomeration start temperature may shift toward the lower temperature side compared to the temperature calculated from these parameters.

Figure 2:
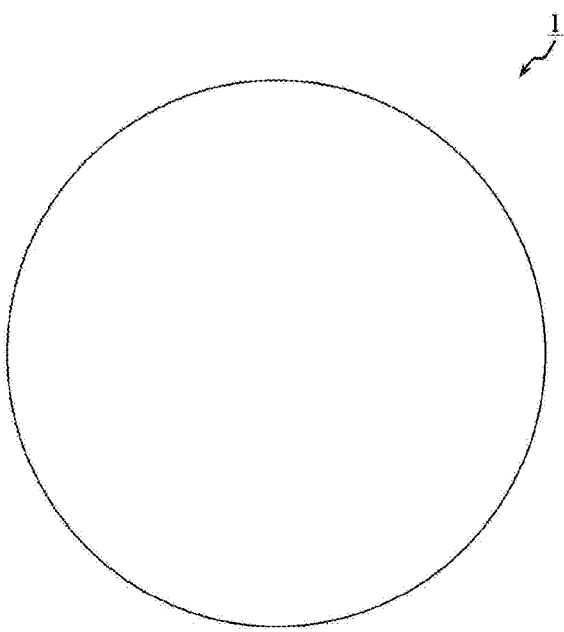
FIG. 2(a) is a plan view showing a schematic structure of a device according to an embodiment of the present invention and FIG. 2(b) is a partial perspective cross-sectional view of the device.
Figure 2:
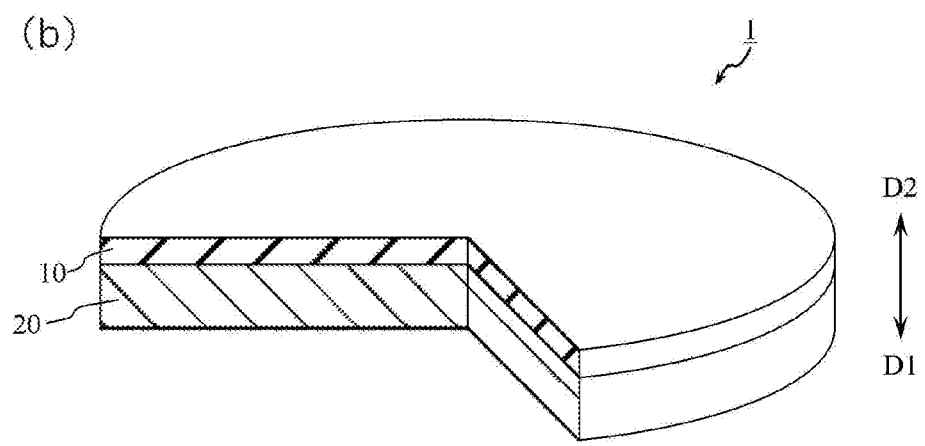

As a result of conducting this heat treatment, a device 1 shown in FIG. 2 can be provided. In the device 1, the existing density of the plurality of metals at the bonding surface can be adjusted to $10^{12}$ atoms/cm$^2$ or less.

In the related art, a metal layer has been needed to join the first substrate 10 to the second substrate 20 at room temperature. This is because the metal serves as a bonding layer and thus an amount of metal sufficient to cover at least the bonding surface has been needed. If the amount of metal is less than this, bonding has not been successfully achieved (for example, refer to Japanese Patent No. 4162094). In other words, about $3.0 \times 10^{16}$ atoms/cm$^2$ or more of the metal has been considered necessary.

Accordingly, in the related art, at least about $3.0 \times 10^{16}$ atoms/cm$^2$ or more of metals have been present between the first substrate 10 and the second substrate 20 and the metals have diffused into the first substrate 10 or the second substrate 20 in the subsequent heat treatment step, thereby adversely affecting performance of the device.

However, according to this embodiment, a FAB gun 102 having a higher energy than an ion gun used in a room-temperature bonding device of the related art is used to increase the degree of activation at the bonding surfaces. Thus, bonding can be achieved at a metal content significantly lower than in the related art and the amount of the plurality of metals supplied can be controlled by providing the metal releasing member 106 and the cover member 107.

The amount of the plurality of metals supplied is preferably controlled by controlling the exposed area of the plurality of metals exposed in the metal releasing member 106. Accordingly, the structural members composed of metal materials present in the vacuum chamber 101 are preferably covered with the cover member 107 as much as possible. In general, the atmosphere inside the vacuum chamber 101 is high vacuum and thus airborne metal particles are supposed to be few. Moreover, since a FAB gun 102 having extremely high directivity is used, the possibility that the vacuum chamber 101 and other members would be sputtered by the FAB gun 102 is supposedly low. Based on these facts and technical common knowledge, the cover member 107 that covers the structural members composed of metal materials in the vacuum chamber 101 is normally unnecessary. However, it has been found that the cover member 107 is necessary in order for the existing density of the plurality of metals to be $10^{12}$ atoms/cm$^2$ or less, which is an extremely small amount of metals. In this example, the structural members composed of metal materials exposing from the cover member 107 other than the metal releasing member 106 are the exhaust 101$a$ and a duct portion continuing therefrom, a portion of the FAB gun 102, a portion of the first stage 103, and a portion of the second stage 104 only.

It is also important to increase the degree of vacuum in the vacuum chamber 101. The higher the degree of vacuum, the lower the amount of the plurality of metals supplied. To be specific, the degree of vacuum is preferably $10^1$ to $10^2$ order higher than the degree of vacuum needed for stable emission from the FAB gun 102.

It is also effective to conduct activation in the activating step while arranging the first substrate 10 and the second substrate 20 not to face each other.

In the activating step, if the first substrate 10 and the second substrate 20 are arranged to face each other and a neutron beam is applied to one of the substrates, the periphery of the stage holding that substrate comes to be etched and the substance removed by etching (etched substance) may float in the vacuum atmosphere and attach to the other facing substrate. If the other substrate is simultaneously activated, the etched substance readily attaches to the other substrate compared to when the other substrate is unactivated. The etched substance contains the metal materials constituting the first stage 103 and the second stage 104 and impurities such as dirt attached to the stage 103 and the stage 104.

In other words, irradiation of a neutron beam for activating the surfaces of the first substrate 10 and the second substrate 20 presumably secondarily causes the stages 103 and 104 to be sputtered because the surfaces to be activated face each other and are simultaneously activated.

In order to test this hypothesis, the amount of metal atoms at an activated surface activated by placing the first substrate 10 and the second substrate 20 to face each other and the amount of metal atoms at an activated surface activated by placing only one of the substrates in the vacuum chamber 101 were measured by taking out the substrate from the vacuum chamber 101 before bonding. As a result, it was confirmed that the amount of metal atoms was drastically decreased in the latter case in which only one of the substrates was activated.

The test experiment described above confirms that it is important for reducing the amount of metal atoms to arrange the first substrate 10 and the second substrate 20 not to face each other in the activating step. The state of the substrates not facing each other is preferably created by, for example, holding the second substrate 20 in a stand-by space isolated from the space where irradiation by using the FAB gun 102 is conducted during activation of the first substrate 10 so that the activation operations of the two substrates are performed separately in terms of both space and time.

As described above, according to the present embodiment, the first substrate 10 can be bonded to the second substrate 20 while decreasing the density of the plurality of metals.

It is because the density of the plurality of metals is adjusted to $10^{12}$ atoms/cm$^2$ or less that occurrence of metal element precipitate portions can be suppressed at the interface while maintaining the bonding. The mechanism therefor is described in detail below.

In the case where metal atoms constituting the plurality of metals are agglomerated between the first substrate 10 and the second substrate 20, it is possible that operation of structural elements, such as semiconductor devices, involved with electrical properties and formed in the first substrate 10 or the second substrate 20 may be adversely affected. Such a problem of agglomeration of metal elements is naturally anticipated in the case where metal atoms exist in a layer form or an island form at the interface (for example, the case where the density of metal atoms at the interface is about $3.0 \times 10^{16}$ atoms/cm$^2$ or less); however, even when the metal atom density is less than about $3.0 \times 10^{16}$ atoms/cm$^2$ and the presence of the metal atoms is not confirmed due to metal atoms being dispersed in the bonding surfaces at the time of bonding, the metal atoms agglomerate as a heat treatment for forming structures such as semiconductor devices proceeds as long as the metal atom density is over $10^{12}$ atoms/cm$^2$. Agglomeration of metal atoms caused by the heat treatment can be prevented at $10^{12}$ atoms/cm$^2$ or less.

Although the mechanism is not clear, it is believed that the solid solubility of the metal elements constituting the plurality of metals relative to the elements constituting the first substrate 10 or the second substrate 20 is relevant. In other words, when the density of the plurality of metals is $10^{12}$ atoms/cm$^2$ or less, the density is not high enough for atoms to contact one another and form agglomerates, the mobility at room temperature is low, and thus the atoms do not form agglomerates during bonding. Moreover, although the mobility is increased by performing the heat treatment, the density of metal atoms is only about 10 times greater than the solid solubility as long as the amount of metals supplied is $10^{12}$ atoms/cm$^2$ or less at the interface; thus, it is believed that agglomerates do not occur even in such a state.

Furthermore, most of metal atoms of the plurality of metals form solid solutions with elements constituting the first substrate 10 or the second substrate 20 and cannot move freely. The rest of the atoms are far from one another and cannot form agglomerates with one another or large defects that might accelerate diffusion.

In the case where one of the first substrate 10 and the second substrate 20 is composed of Si and Fe is included in the metal elements constituting the plurality of metals, the number of OSF defects rapidly increases once the density of Fe is increased beyond $10^{12}$ atoms/cm$^2$. One of the causes for OSF defects is lattice defects. It is possible that the lattice defects would serve as a trigger for Fe—O compounds to move and precipitate at the surfaces, thereby forming OSF defects. The threshold of the existing amount of Fe at which OSF defects occur coincides with the upper limit of the density of the plurality of metals in this embodiment.

There is no direct relevance between OSF defects and agglomeration of metals; however, they have something in common if the focus is shifted to the movement, agglomeration, and precipitation of metal atoms in the semiconductor layer. The factors that cause OSF defects are the presence of defects and bonding of metal (Fe) and oxygen. With respect to these factors, it is possible that dangling bonds remain as defects at the bonding interface since the first substrate 10 and the second substrate 20 of the device 1 according to this embodiment are directly bonded to each other by activation of the bonding surfaces and formation dangling bonds. Moreover, it is also possible that the heat treatment conducted after bonding may cause the metal elements constituting the plurality of metals and the elements constituting the first substrate 10 or the second substrate 20 to form intermetallic compounds at the bonding interface. These two hypotheses, namely, co-existence of the defects and intermetallic compounds at the interface, satisfy the two conditions of occurrence of the OSF defects. This suggests that there is a possibility in the device 1 according to this embodiment that the intermetallic compounds constituted by the plurality of metals may move and precipitate from the defects at the interface as in the case of the OSF defects occurring due to the movement and precipitation of Fe from the defects. In light of the description above, it can be assumed that diffusion and agglomeration of the metal elements can be suppressed by adjusting the density of the metal elements constituting the plurality of metals to a value not greater than the threshold for occurrence of OSF defects.

Note that the lower limit of the density of the metal elements constituting the plurality of metals is not particularly limited but the metal elements sufficient for achieving room-temperature bonding of the first substrate 10 and the second substrate 20 need to be present. To be specific, it has been confirmed that when the density of the plurality of metals is $10^{10}$ atoms/cm$^2$ or more at the time of bonding, a bonding strength comparable to when bonding is performed with a large amount of metals in accordance with Japanese Patent No. 4162094 is achieved. Note that it can be inferred that, in some cases, the density may drop to about $10^8$ atoms/cm$^2$ due to diffusion from the bonding interface during the heat treatment performed after bonding.

As discussed above, according to the present embodiment, a device 1 in which agglomeration of the plurality of metals at the interface is prevented and the bonding strength between the first substrate 10 and the second substrate 20 is sufficient can be provided.

The first substrate 10 and the second substrate 20 may be composed of the same material or different types of materials. Examples of the materials include oxides such as AlO$_x$, SiO$_x$, TiO$_x$, and ZrO$_x$, nitrides such as AlN$_x$ and SiN$_x$, carbides such as SiC and AlC, fluorides, piezoelectric materials such as lithium tantalate and lithium niobate, electrostrictive materials, optical crystal materials such as YAG, and semiconductor materials such as Si, Ge, SiGe, and GaN. In particular, when the first substrate 10 or the second substrate 20 is composed of a semiconductor material, the presence of the metals at the bonding interface may greatly affect the properties of the device 1.

For example, when a Si semiconductor single crystal is used as the first substrate 10, a sapphire substrate is used as the second substrate 20, and an SOS structure is employed, the presence of metal atoms at the bonding interface between the first substrate 10 and the second substrate 20 is important and the amount, distribution, etc., of the metal atoms need to be controlled.

Modification Example 1

In the activating step, the surface of the first substrate 10 and the surface of the second substrate 20 may be activated without being arranged to face each other. In particular, when the activating step and the step of attaching metals are performed simultaneously, activation may be conducted without arranging the surface of the first substrate 10 and the surface of the second substrate 20 to face each other.

The surface of the first substrate 10 and the surface of the second substrate 20 are arranged so as not to face each other and activated by using the FAB gun 102. The surfaces of the first substrate 10 and the second substrate 20 do not directly face each other when being activated. Hereinafter, this state may be referred to as "non-facing state". The non-facing state also refers to a state in which something else lies between the two substrates.

Figure 3:
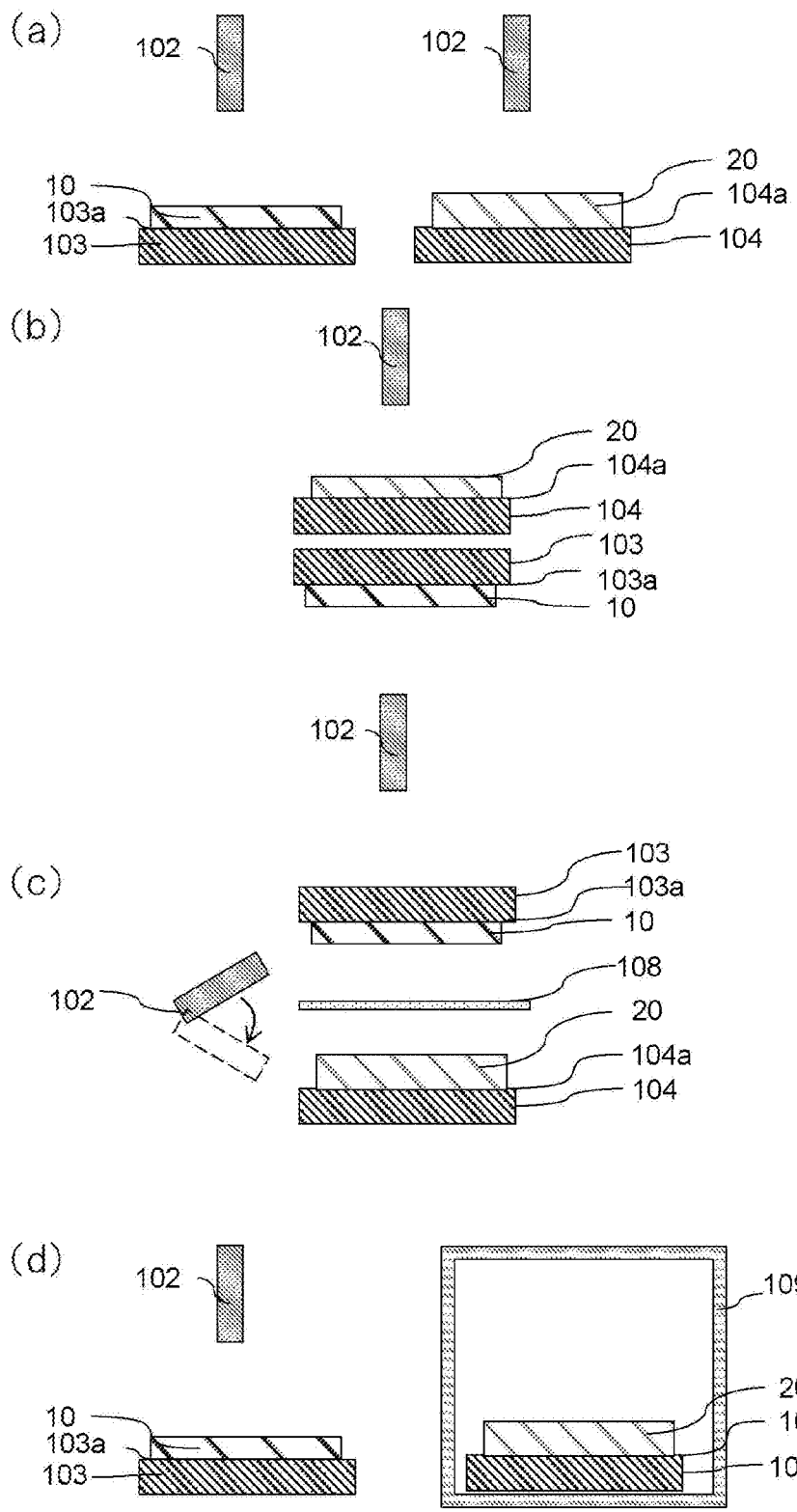
FIG. 3(a) to (d) are diagrams of relevant portions showing examples of arranging a first stage and a second stage within a vacuum chamber 2.

Examples of the non-facing state are described with reference to FIG. 3. FIG. 3 includes diagrams of relevant portions in a vacuum chamber 101 of a room-temperature bonding device 100. Some of the structures are omitted from the drawings to clarify the positional relationship between the first stage 103 and the second stage 104.

This non-facing state may be realized by arranging a substrate holding surface 103a of the first stage 103 and a substrate holding surface 104a of the second stage 104 to face in the same direction and irradiating the surfaces by using the FAB gun 102 in the same direction, as shown in FIG. 3(a). In particular, as shown in FIG. 3(a), the positions in plan view are preferably shifted. In other words, in the XY plane, the position where the first stage 103 lies preferably does not overlap the position where the second stage 104 lies in the step of activating surfaces.

Alternatively, as shown in FIG. 3(b), the positions may overlap each other in plan view and the substrate holding surface 103a of the first stage 103 and the substrate holding surface 104a of the second stage 104 may be placed back to back. In other words, the substrate holding surface 103a of the first stage 103 and the substrate holding surface 104a of the second stage 104 may be placed to face opposite directions and the other surface of the first stage 103 opposite to the substrate holding surface 103a and the other surface of the second stage 104 opposite to the substrate holding surface 104a may be arranged to face each other. The surface of the first substrate 10 and the surface of the second substrate 20 are then activated by using FAB guns 102 arranged to face the substrate holding surface 103a of the first stage 103 and the substrate holding surface 104a of the second stage 104, respectively.

Alternatively, as shown in FIG. 3(c), the substrate holding surface 103a of the first stage 103 and the substrate holding surface 104a of the second stage 104 may be arranged so as to form a gap therebetween and a shielding plate 108 composed of an insulator may be disposed between the two surfaces. A FAB gun 102 is positioned on the side surface side of the first stage 103 and the second stage 104 and applies a neutron beam to the substrate held on the substrate holding surface 103a of the first stage 103 and the substrate held on the substrate holding surface 104a of the second stage 104 while being turned by a position adjusting mechanism not shown in the drawing.

The shielding plate 108 is preferably composed of a substance that is resistant to sputtering by irradiation from the FAB gun 102. Examples of the material that can be used include single-crystal materials such as quartz and ceramic materials such as silicon oxide, aluminum oxide, and silicon nitride. In the case where a material that affects electrical properties is used in the first substrate 10 or the second substrate 20, the shielding plate 108 is preferably formed from an insulator that contains, as a main component, the same element as the main-component element constituting the substrates. In the case where a silicon substrate is used as the first substrate 10, for example, silicon oxide ($SiO_x$) is preferably used. Even if the shielding plate 108 has come to be etched by irradiation from the FAB gun 102, the atoms of the element constituting the first substrate 10 will float and the effect of the atoms can be suppressed to a low level even if the atoms attached to the first substrate 10. In the case where a sapphire substrate is used as the second substrate 20, aluminum oxide ($AlO_x$) is preferably used. Even if the shielding plate 108 has come to be etched by irradiation from the FAB gun 102, the atoms of the element constituting the second substrate 20 will float and the effect of the atoms can be suppressed to a low level even if the atoms attached to the second substrate 20.

Alternatively, as shown in FIG. 3(d), one of the substrates may be moved to a stand-by space 109 isolated from the space where the other substrate is being activated in the vacuum chamber 102 by irradiation from the FAB gun 102. According to this configuration, activation of the surface of the first substrate 10 and the activation of the surface of the second substrate 20 can be separated from each other in terms of both space and time and the non-facing state can be realized in terms of both space and time.

For the cases shown in FIG. 3, part (a) to (c), activation of the surface of the first substrate 10 and activation of the surface of the second substrate 20 may be conducted simultaneously or separately with time intervals. When activation is performed separately with time intervals, activation of the first substrate 10 and activation of the second substrate 20 can be separated from each other in terms of space and time and the amount of metals can be further reduced, which is preferable.

In the above-described cases, preferably, the substrate holding surface 103a (the surface facing downward in FIG. 1) of the first stage 103 can be made to face upward and the substrate holding surface 104a (the surface facing upward in FIG. 1) of the second stage 104 can be made to face downward. This is because the first surface 10a and the second surface 20a can be easily arranged to face each other during the bonding step. In other words, the first stage 103 and the second stage 104 are capable of moving in the XYZ directions and rotating about the axis in one direction. The directions in which the substrate holding surface 103a of the first stage 103 and the substrate holding surface 104a of the second stage 104 face coincide with the directions in which the surface of the first substrate 10 and the surface of the second substrate 20 held on these surfaces face.

In FIG. 3, an example of performing the activating step and the bonding step in the same vacuum chamber 102 is illustrated. Alternatively, a vacuum chamber used for the activating step only may be provided, the first substrate 10 and the second substrate 20 may be placed in that container one by one, and the substrates may be removed from the container after activation and transferred to another vacuum chamber for the bonding step. In such a case, the positions of the FAB gun 102 and the metal releasing member 106 can be optimized for activation without considering the bonding step and the structure of the container can be reduced in size and simplified compared to the vacuum chamber for bonding. Thus, the degree of vacuum can be increased and unintended impurities can be eliminated.

Figure 4:
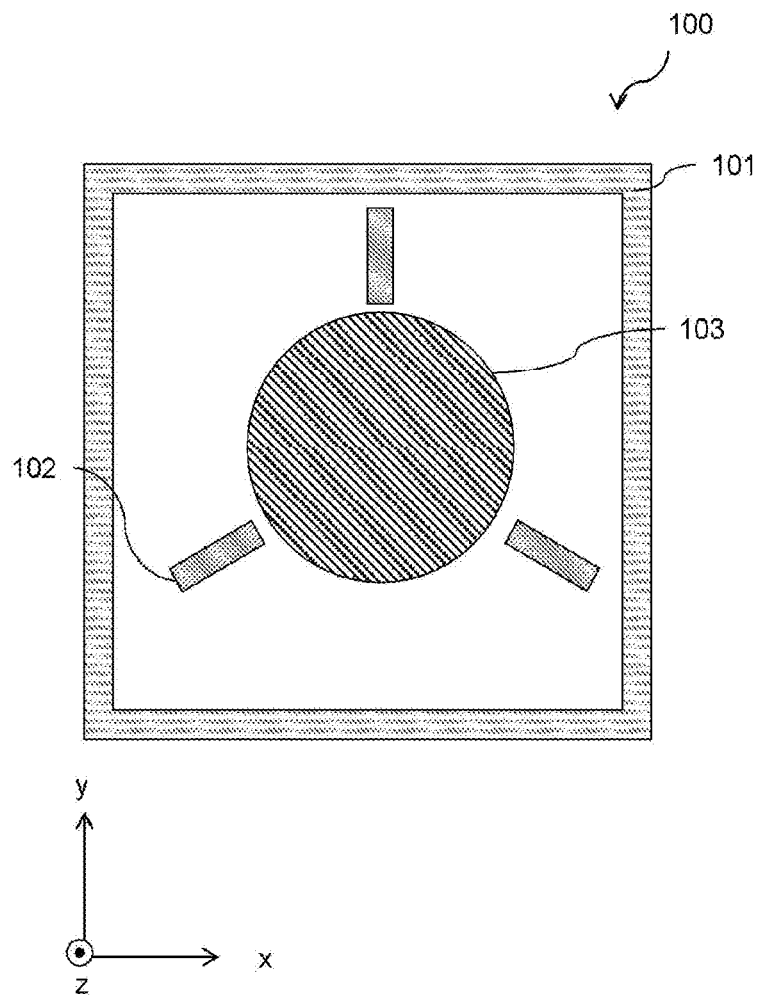
FIG. 4 is a schematic view showing an example of arrangement of FAB guns in a bonding device.

With the increase in size of the first substrate 10 and the second substrate 20, plural FAB guns 102 are needed to evenly activate all parts of the surfaces. In such a case, as shown in FIG. 4, FAB guns 102 are preferably arranged not to face one another. FIG. 4 is a plan view in perspective when viewed from above the vacuum chamber 101. Since neutron beams from the FAB guns 102 have high energy, the constitutional parts of the structures of the FAB guns 102 would be sputtered and the properties of the device 1 may be affected if the FAB guns 102 are at positions facing one another.

In the case where plural FAB guns 102 are arranged to face each other, each FAB gun 102 may be covered with a cover composed of the same material as the shielding plate 108 to minimize the exposure of the FAB gun 102. Alternatively, when one of the FAB guns 102 is being used for irradiation, the FAB gun 102 at a position facing this FAB gun 102 may be covered with a cover to prevent the FAB guns 102 from facing each other in terms of time.

Modification Example 2

In the heating step, the heating temperature is set to be equal to or greater than the agglomeration start temperature of the elements constituting the first substrate 10 or the second substrate 20 and the plurality of metals. The heating temperature may be higher than this. For example, heating may be performed for a particular length of time at a temperature at which the elements constituting the first substrate 10 or the second substrate 20 and the plurality of metals form intermetallic compounds. In the case where a silicon single-crystal substrate is used as the first substrate 10, heating may be performed at a thermal oxidation temperature of silicon.

Figure 5:
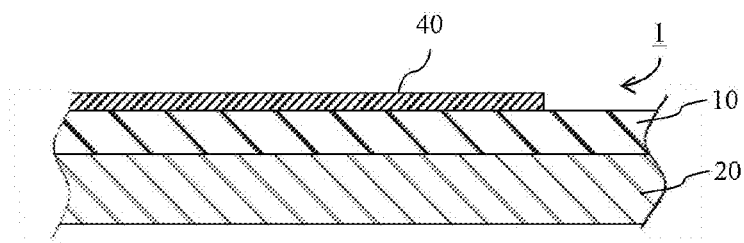
FIG. 5 is a cross-sectional view showing a modification example of the device shown in FIG. 2.

In particular, Si single crystals may be selected as the first substrate 10 and heating may be performed at a silicon thermal oxidation temperature during the heating step to form an oxide layer 40 on a main surface of the first substrate 10, the main surface being opposite to the surface in contact with the second substrate 20. A device obtained through such a process is illustrated in FIG. 5.

As such, in the case where a part of the first substrate 10 is oxidized into an oxide layer 40, Si is pushed out due to volume change from the oxide layer 40 into the portion that remains as the first substrate 10 and the amount of the interstitial Si is increased at the oxide layer 40-side surface of the first substrate 10, thereby increasing the Si atom density per unit volume.

In contrast, there is no oxide layer between the first substrate 10 and the second substrate 20 and no increase in Si atoms. The presence of the interstitial Si is known to serve as a cause for accelerating OSF defects. In the device 1, the portion where the metal elements that cause OSF defects may enter is the interface between the first substrate 10 and the second substrate 20. However, occurrence of the OSF defects can be suppressed because the Si atom density per unit volume, which is an indicator of the interstitial Si density, near the interface is decreased compared to the oxide layer 40-side surface.

Moreover, because there are fewer interstitial Si atoms at the second substrate 20-side surface of the first substrate 10 than at the oxide layer 40-side surface of the first substrate 10, occurrence of tensile strain in the crystal structure of the first substrate 10 can be suppressed and the effect on the carrier mobility of the semiconductor device can be suppressed. Such strain caused by interstitial Si or the like can be estimated by forming a semiconductor device in the first substrate 10 and measuring the carrier mobility and the like.

Modification Example 3

In the embodiment described above, a semiconductor composed of Si single crystals is preferably used as the first substrate 10 and a sapphire substrate having an R-plane as the bonding surface is preferably used as the second substrate 20 in the activating step.

The lattice spacing at the R-plane of the sapphire substrate and the lattice constant of the Si single crystals are close compared to a C-plane of a sapphire substrate or the like. Thus, a device in which disturbance of the crystal structure on the first surface 10a side of the first substrate 10 caused by lattice constant mismatching is suppressed can be obtained.

In the related art, the first substrate 10 and the second substrate 20 have been bonded to a layer composed of metal elements having completely different crystallinity and lattice constants and thus the lattice constants of the two substrates have had small relevance with the properties in making the semiconductor device.

However, according to the above-described embodiment in which the density of the plurality of metals is $10^{10}$ atoms/cm$^2$ or more and $10^{12}$ atoms/cm$^2$ or less, the proportion of the atoms constituting the first substrate 10 coming into direct contact with the atoms constituting the second substrate 20 is significantly high. To be specific, since the total number of atoms per 1 cm$^2$ is assumed to be about $10^{16}$ atoms in this example, the proportion of the atoms bonded through metal elements constituting the plurality of metals will be on the ppm order.

Accordingly, the lattice constants of the first substrate 10 and the second substrate 20 carry significance. That is, since the lattice constants are close to each other and there is little mismatch, the two substrates are strongly bonded; moreover, since disturbance in the crystal structure of the first substrate 10 is suppressed, the possibility of deterioration of the properties of the semiconductor device caused by occurrence of transitions that cause carrier trapping or unintended stress generated by strain is low.

Moreover, since the first substrate 10 can be directly bonded to the second substrate 20 with little mismatch in lattice constant between the two substrates, the semiconductor properties of Si are not adversely affected and can be fully utilized, thereby suppressing generation of a capacitance between the two substrates. In other words, a device 1 that fully utilizes semiconductor properties of the first substrate 10 composed of Si and low-dielectric constant properties of the second substrate 20 composed of sapphire can be provided.

Moreover, since the R-plane sapphire is used as the second substrate 20, the Al atoms align on the bonding surface bonded to the first substrate 10 and no O atoms remain exposed. Accordingly, the first substrate 10 and the second substrate 20 can be bonded to each other without having O atoms, which cause OSF defects, involved in bonding and thus occurrence of OSF defects can be suppressed. Moreover, even in the case where an insulating oxide is used as the second substrate 20, the metal atoms can be bonded to each other. Thus, the bonding strength can be increased.

Since the R-plane sapphire is used as the second substrate 20, the proportion of the dangling bonds (unattached bonds) not involved in bonding can be decreased in bonding the substrates by bringing the activated surfaces of the first substrate 10 and the second substrate 20 in contact with each other. As a result, defects and voids at the bonding interface, which are caused by unattached species at the bonding interface, can be reduced and the state of the bonding interface can be improved. Since defects and voids at the bonding interface are reduced, agglomeration and diffusion of metal atoms can be suppressed.

Modification Example 4

In the activating step in the above-described embodiment, Si single crystals are preferably used as the first substrate 10 and the oxygen concentration in the first substrate 10 is preferably adjusted to less than $5 \times 10^{17}$ [atoms/cm$^3$]. If the oxygen concentration in the first substrate 10 is high, oxygen bonds with metal elements and accelerates movement and diffusion of the metal atoms constituting the plurality of metals. In contrast, when the oxygen concentration is controlled as described above, diffusion, formation of solid solution, and precipitation of the metals in the first substrate 10 are suppressed. In particular, when the metal is Fe, occurrence of OSF defects can be suppressed.

In order to control the oxygen concentration of the first substrate 10 as such, a Si epitaxial layer may be formed on a single-crystal Si substrate and, after the epitaxial layer side is bonded to the second substrate 20, the single-crystal Si substrate may be removed so that the remaining epitaxial layer can serve as the first substrate 10. When an epitaxial layer is used as the first substrate 10, the amount of oxygen mixed therein can be suppressed while maintaining high crystallinity since the epitaxial layer is a film formed in vacuum.

Modification Example 5

In Modification Example 4, the surface (namely, the surface of the epitaxial layer) of the first substrate 10 coming into contact with the second substrate 20 is preferably undoped. According to this configuration, occurrence of strain in the crystals of the first substrate 10 caused by the presence of the dopant can be suppressed and the likelihood of deterioration of properties of the semiconductor device caused by occurrence of transitions that cause carrier trapping or occurrence of unintended stresses caused by strain is decreased.

In order to realize this configuration, the following steps may be sequentially performed. That is, first, a Si epitaxial layer is formed on a single-crystal Si substrate in such a manner that the Si epitaxial layer is undoped or has a dopant concentration gradually decreasing toward the surface, creating an undoped state at the surface. Next, the epitaxial layer side is bonded to the second substrate 20. Subsequently, the single-crystal Si substrate is removed and the epitaxial layer is used as the first substrate 10. Since the epitaxial layer is used as a substrate, the dopant content ca be easily controlled while maintaining high crystallinity.

During this process, an undoped epitaxial layer may be formed on a single-crystal Si substrate having a high dopant concentration so that the dopant concentration distribution can be formed in the epitaxial layer as a result of diffusion of the dopant from the substrate side.

Modification Example 6

In the embodiment described above, the plurality of metals preferably form metal silicides or metal oxides in the heating step. Examples thereof include $SiFeO_x$ and $AlFeO_x$.

In order to induce metal atoms constituting the plurality of metals to form intermetallic compounds such as metal silicides or metal oxides, a heat treatment at 500° C. or higher is performed for 0.5 hours or more after the bonding step. This heat treatment allows the metal atoms to bond with the elements constituting the first substrate 10 or elements constituting the second substrate 20 and form the intermetallic compounds. Since the metal atoms are supplied at the time both bonding surfaces of the first substrate 10 and the second substrate 20 are activated, the metal atoms are present at the bonding interface and bonds with the atoms present at the bonding surfaces of the first substrate 10 and the second substrate 20 are formed by the heat treatment.

In the device 1, the density of plurality of metals present at the bonding interface is adjusted to $10^{12}$ atoms/cm$^2$ or less and thus diffusion and agglomeration of metal atoms can be suppressed. Accordingly, the plurality of metals taking the form of intermetallic compounds stay at the bonding interface between the first substrate 10 and the second substrate 20. As the metal elements form intermetallic compounds, voids are created around the intermetallic compounds since elements constituting the first substrate 10 are used in bonding with the metal elements and since the elements constituting the second substrate 20 are used in bonding with the metal elements. These voids serve as defects and when new impurities are present at the interface, diffusion of the impurities into the first substrate 10 can be suppressed due to gettering.

Modification Example 7

In the embodiment and modification examples thereof described above, the first substrate 10 may be a substrate or a thin layer. Preferably, a step of reducing the thickness of the layer is added after the bonding step to control the thickness to be in the range of 30 nm to 200 nm.

In order to reduce the thickness, first, a heavily doped single-crystal Si substrate and an undoped epitaxial layer film formed thereon are used as the first substrate 10 in the activating step.

During the epitaxial growth, the dopant diffuses into the epitaxial film from the heavily doped single-crystal Si substrate. As a result, a state is created in which the lower surface of the epitaxial film has a high dopant concentration and the upper surface side of the epitaxial film is in an undoped state. The upper surface is irradiated by using the FAB gun 102 to form a first surface 10a. Then the upper surface of the epitaxial film is bonded to the second substrate 20 in the bonding step.

A step of reducing the thickness of the layer is performed next. To be more specific, after the substrates are bonded, the heavily doped single-crystal Si substrate and a portion of the epitaxial film, the portion having a particular amount or more of the dopant diffusing from the substrate, are removed. This removal may be performed by using, for example, a selective etchant with which the etching rate is high at high dopant concentrations but rapidly decreases after a particular dopant concentration. Examples of such a selective etchant include a hydrofluoric acid/nitric acid/acetic acid mixture and a hydrofluoric acid/nitric acid/water mixture. The description below involves use of a hydrofluoric acid/nitric acid/acetic acid mixture as a specific example of the etchant. This etchant is adjusted so that the silicon etching rate thereof decreases by a particular value or more at a threshold resistivity higher than the resistivity of the first substrate 10. In other words, the etchant is adjusted so that the silicon etching rate decreases by a particular value or more at a dopant concentration corresponding to the threshold which is a dopant concentration lower than the dopant concentration of the first substrate 10. The "etching rate decreases by a particular value or more" refers to the case in which an inflection point is present on a graph showing the relationship between the etching rate and the dopant concentration or the case in which the etching rate decreases by $\frac{1}{10}$ or more at the threshold. In this example of the embodiment that employs p-type silicon, the etchant is adjusted such that the etching rate significantly decreases after a threshold resistivity of 1 to 4 [Ω·cm] (the dopant concentration corresponding to this threshold is $7\times10^{17}$ to $2\times10^{18}$ [atoms/cm$^3$]). For example, when the hydrofluoric acid/nitric acid/water mixing ratio is 1:3:8, the etching rate changes by 1/1000 or more after the threshold value. It should be noted that other examples of the method for performing selective etching include an electrolytic etching method performed in an aqueous hydrogen fluoride solution having a concentration of about 5% and a pulse electrode anodization method performed in a KOH solution. When such an etchant is used, the dopant concentration change in the epitaxial film automatically serves as an etch stop layer. The heavily doped single-crystal Si substrate and a part of the epitaxial film are removed as such and the remaining portion is used as a new first substrate 10. The first substrate 10 obtained through this process is an undoped region and the dopant concentration therein is, for example, $1 \times 10^{16}$ [atoms/cm$^3$] or less for the p$^-$ dopant concentration and $5 \times 10^{15}$ [atoms/cm$^3$] or less for the n$^-$ dopant concentration. The meaning of the term "undoped" is not limited to impurity-free intrinsic silicon and the like and the term may be used to refer to silicon with which an impurity is not intentionally doped. In this example, boron (B) is used as the dopant. As described above, the first substrate 10 remaining in the device 1 becomes an undoped complete depletion layer and the thickness of the complete depletion layer can be adjusted to 200 nm or less. In the device 1 formed through this process, the first substrate 10 is directly bonded to the second substrate 20 at room temperature without using an oxide layer or the like and thus occurrence of OSF defects is suppressed and a first substrate 10 that is dense and has fewer defects can be made. Moreover, since the first substrate 10, which is a complete depletion layer that is thin and has fewer defects, is directly bonded to the second substrate 20, the advantageous features, such as insulating properties and high heat-releasing properties, of the second substrate 20 can be reflected in the semiconductor device.

Furthermore, the strains caused by the difference in thermal expansion coefficient between the first substrate 10 and the second substrate 20 can be decreased by conducting the step of reducing the thickness of the layer prior to the heating step. As a result, cracking of the first substrate 10 and disbonding of the first substrate 10 and the second substrate 20 in the heating step can be suppressed.

EXAMPLES

Example 1

Based on the above-described embodiment, a device 1 was formed under the following conditions:
Second substrate 20: 6-inch sapphire substrate
Bonding surface (main surface) 20a of the second substrate 20: R-plane
First substrate 10: An undoped Si epitaxial film having a thickness of 2 μm was formed on a single-crystal Si substrate having a resistivity of 0.01 to 0.02 Ωcm. The oxygen concentration during the film formation was $10^{17}$ atoms cm$^2$ or less. The epitaxial film was removed along with the single-crystal substrate by leaving only a portion having a thickness of 200 nm. This remaining portion was used as the first substrate 10. The dopant concentration of the first substrate 10 was $1 \times 10^{16}$ atoms/cm$^2$ or less and was confirmed to be a complete depletion layer.
Bonding conditions: In a room-temperature bonding device, the second substrate 20 and the first substrate 10 were respectively irradiated by using FAB guns in a high vacuum of $1 \times 10^{-5}$ Pa or less to activate the bonding surfaces and then the activated bonding surfaces were brought into contact with each other and bonded. The interior of the room-temperature bonding device was covered with an insulating covering member. SUS was used as the metal releasing member 106 which was covered with a covering member except for some portion.
Heating conditions: A heat treatment was conducted at 900° C. for 30 minutes in an oxygen atmosphere.

Comparative Example 1

A comparative sample of Comparative Example 1 was formed under the same conditions as Example described above except for the following bonding conditions:
Bonding conditions: In a room-temperature bonding device, the second substrate 20 and the first substrate 10 were respectively irradiated by using ion guns in a high vacuum of $1 \times 10^{-5}$ Pa or less to activate bonding surfaces and then the activated bonding surfaces were brought into contact with each other and bonded. Here, the metal portions of the interior of the room-temperature bonding device remained uncovered.

Comparative Example 2

A comparative sample of Comparative Example 2 was formed under the same conditions as Example described above except for the following bonding conditions:
Bonding conditions: In a room-temperature bonding device, the second substrate 20 and the first substrate 10 were respectively irradiated by using FAB guns in a high vacuum of $1 \times 10^{-5}$ Pa or less to activate bonding surfaces and then the activated bonding surfaces were brought into contact with each other and bonded. Here, the interior of the room-temperature bonding device was covered with an insulating covering member but the amount of the uncovered metal releasing member was increased compared to Example in order to increase the amount of metals present at the bonding interface.

Comparative Example 3

In Comparative Example 3, a surface of a single-crystal Si substrate serving as the first substrate 10 was thermally oxidized to form an oxide film (SiO$_2$ film) having a thickness of 300 nm. The oxide film was bonded to the second substrate 20 under the same bonding conditions as in Comparative Example 1.

(Observation of Bonding Interface)

Bonding interfaces between the first substrates 10 and the second substrates 20 of the devices obtained in Example and Comparative Examples 1 and 2 not subjected to a heat treatment at a temperature exceeding 300° C. after the room-temperature bonding were subjected to cross-sectional observation with a transmission electron microscope (TEM).

To be specific, the cross sections for observation were prepared by ion milling and observation was conducted with TEM (H-9000NAR produced by Hitachi High-Technologies Corporation) at an acceleration voltage of 200 kV and observation magnification factor of 2050000 (2 million 50 thousand-fold magnification).

Figure 6:
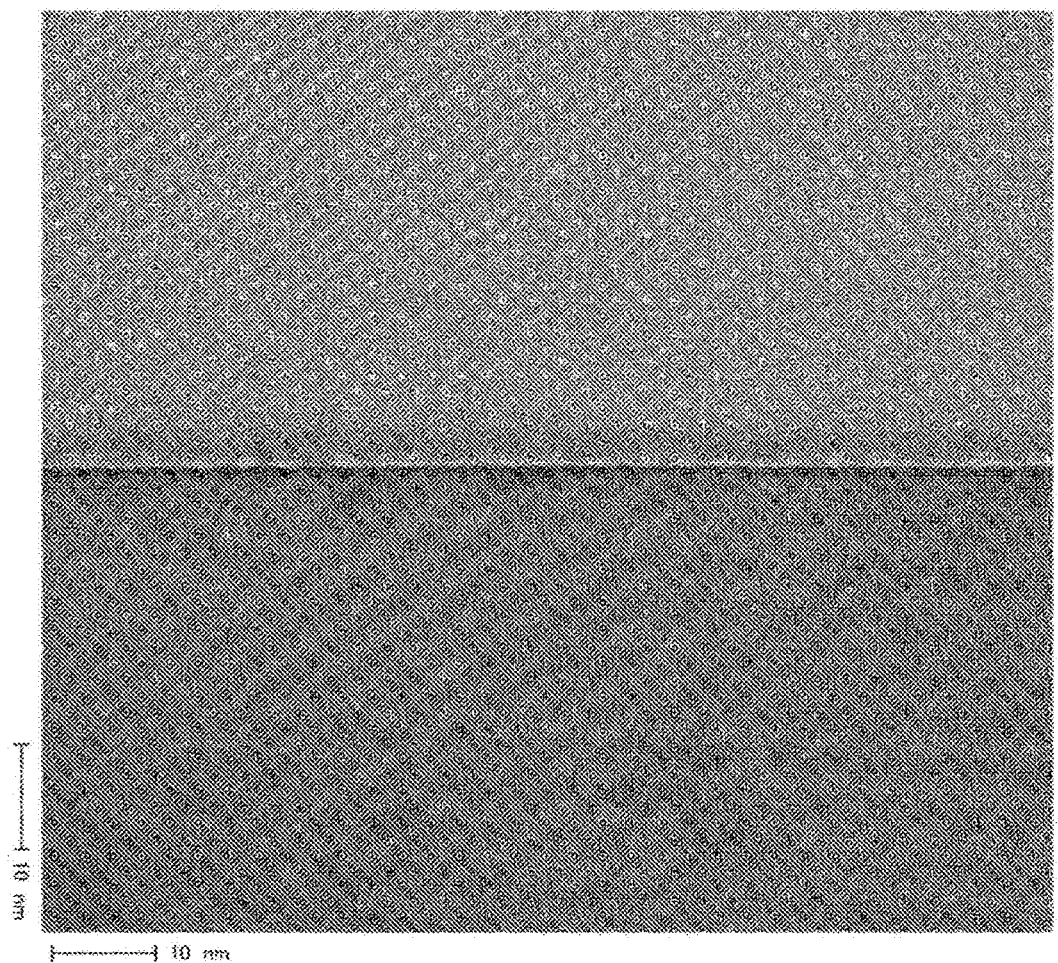
FIG. 6 is a cross-sectional TEM photograph at a bonding interface of a device according to Comparative Example 1.

As a result, precipitation of metals was not observed in Example and Comparative Example 2. For Comparative Example 1, as shown in FIG. 6, a modified layer having a thickness of 5 nm or less and different from Si single crystals was observed at the interface.

(Amount of Metal)

The density of the plurality of metals in Example 1 and Comparative Examples 1 and 2 was measured. To be specific, the thickness of the first substrate 10 was reduced to 500 nm and then the upper surface of the first substrate 10 was covered with a mask having an opening 50 mm in diameter and the portion of the first substrate 10 exposing from the mask opening was etched with a nitric acid/ hydrofluoric acid mixture so that the portion dissolved in the etchant. All of the dissolved liquid was placed in an evaporating dish. The residue obtained after heating and evaporation to dryness was dissolved in an acid and the resulting solution was measured by ICP-MS. These procedures were conducted in a clean room (class 100).

The element mass (ng) obtained by ICP-MS measurement was divided by the atomic weight of each element to convert the mass into the number of moles, and the result was multiplied by the Avogadro number to obtain the number of atoms. Based on the assumption that these metal atoms are present in a region 5 nm or less in thickness from the interface according to the bonding interface observation results obtained earlier, the converted number of atoms was divided by 5 nm and the area of the mask opening so as to obtain the number of atoms per unit area. The results are shown in Table 1. The detection lower limit of each element is also shown in Table 1.

The element which is a main component of the second substrate 20 and the element which is a main component of the first substrate 10, namely, Al and Si, are omitted from the metal elements constituting the plurality of metals.

TABLE 1

| | Density: Number of atoms per unit area × $10^{10}$ atms/cm$^2$ | | | | | | | | | |
|---|---|---|---|---|---|---|---|---|---|---|
| | Na | K | Ca | Ti | Cr | Fe | Ni | Cu | Zn | Total |
| Example | — | — | — | — | 1.2 | 4.4 | 30 | — | — | 3.56E+11 |
| Comparative Example 1 | 37 | 8.6 | 100 | 90 | 220000 | 770000 | 73000 | 3800 | 41 | 1.07E+16 |
| Comparative Example 2 | 4 | — | 8.4 | 3.2 | 4300 | 1500 | 1400 | 73 | 1.9 | 2.08E+14 |
| Detection lower limit | 2.7 | 1.6 | 1.5 | 1.3 | 1.2 | 1.1 | 1 | 0.97 | 0.94 | |

As shown in Table 1, the amount of metals in Comparative Example 2 in which activation was conducted with FAB guns instead of ion guns exceeds $1\times10^{12}$ atoms/cm$^2$. It is Example in which FAB guns were used and the amount of the plurality of metals of the metal releasing member exposed from the protective cover was adjusted that confirmed for the first time that an amount of metals of $1\times10^{12}$ atoms/cm$^2$ or less was achieved.

SIMS analysis was performed on Example and Comparative Examples 1 and 2 in a depth direction from the first substrate 10 side toward the bonding interface and it was confirmed that metal atoms were not found in the portion beyond 5 nm from the interface.

(Bonding Strength)

Next, the bonding strength was measured for Example 1 and Comparative Examples 1 and 2 described above. To be more specific, five square samples each about 1 cm on a side were cut out from each of samples of Example 1 and Comparative Examples 1 and 2 at freely chosen five positions (peripheral portions, central portions, etc.) and the tensile strength was measured by using a thin-film adhesion strength tester Romulus produced by Quad Group Inc. The results confirmed that a bonding strength comparable to that of Comparative Examples 1 and 2 was observed in Example 1 also.

(Confirmation of Bonding State with Less Mismatching)

The bonding interface of the device 1 of Example 1 was observed. In particular, a cross section including the bonding interface between the first substrate 10 and the second substrate 20 of the device 1 after heating was formed by ion milling and observation was conducted with a TEM (H-9000NAR produced by Hitachi High-Technologies Corporation) at an acceleration voltage of 200 kV and an observation magnification factor of 2050000 (2 million 50 thousand-fold magnification).

Figure 7:
FIG. 7 is a cross-sectional TEM photograph at a bonding interface of a device according to Example.
Figure 8A:
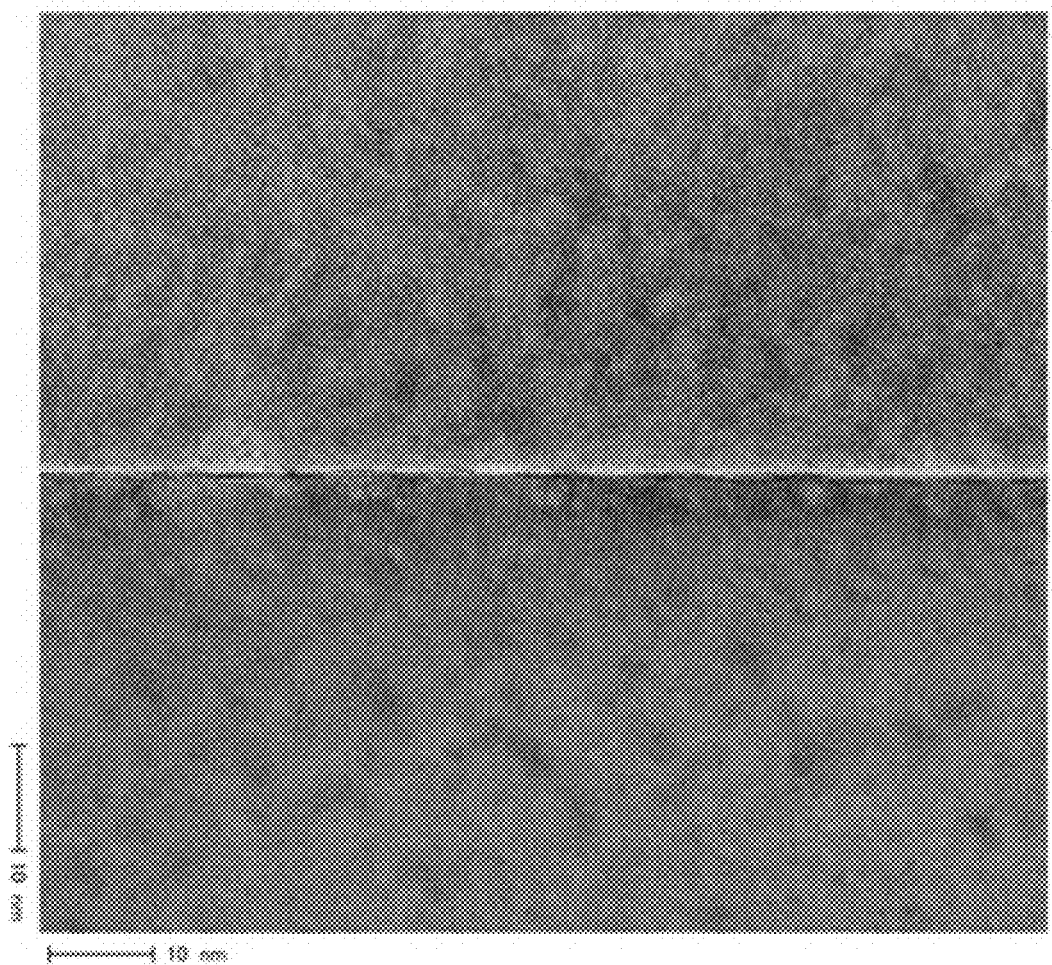
FIG. 8A is a cross-sectional TEM photograph at a bonding interface of a device according to Example.
Figure 8B:
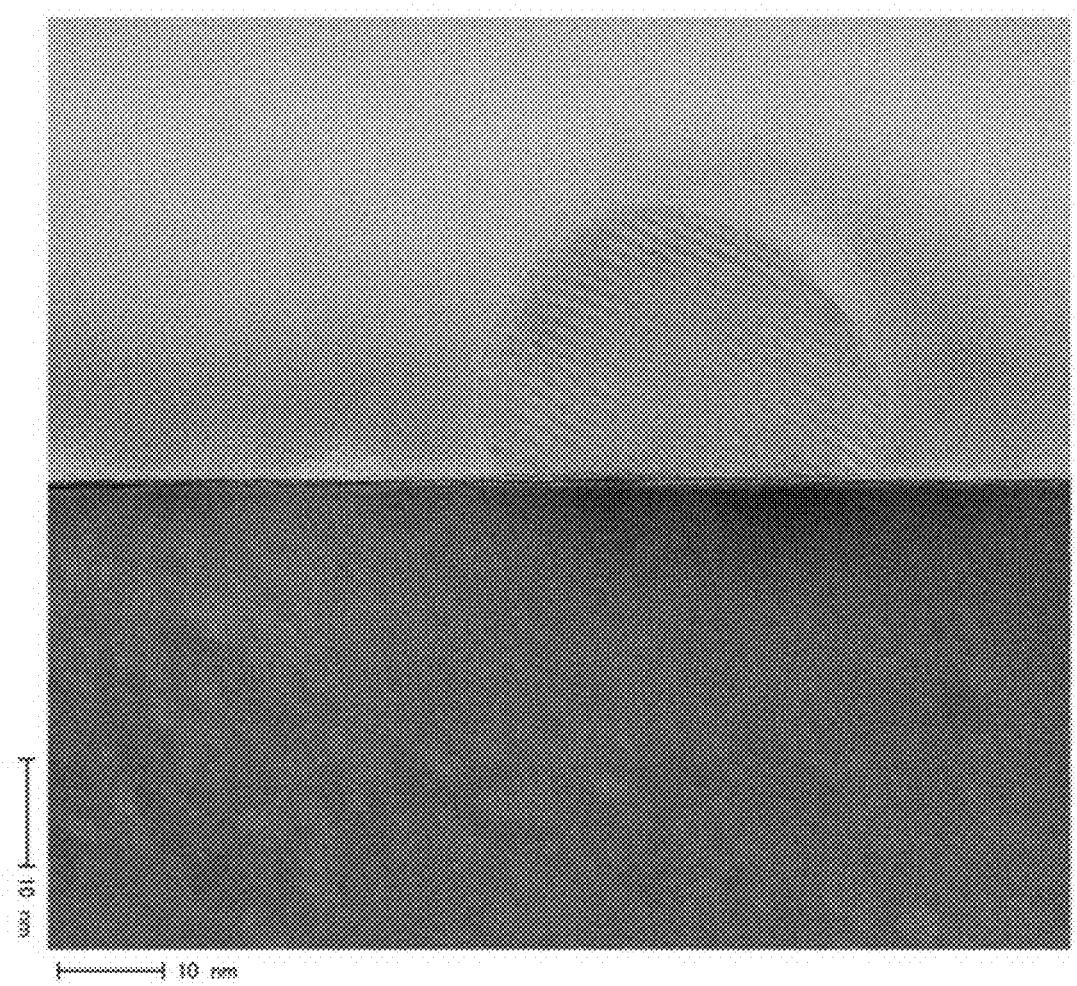
FIG. 8B is a cross-sectional TEM photograph at a bonding interface of a device according to Comparative Example 1.
Figure 8C:
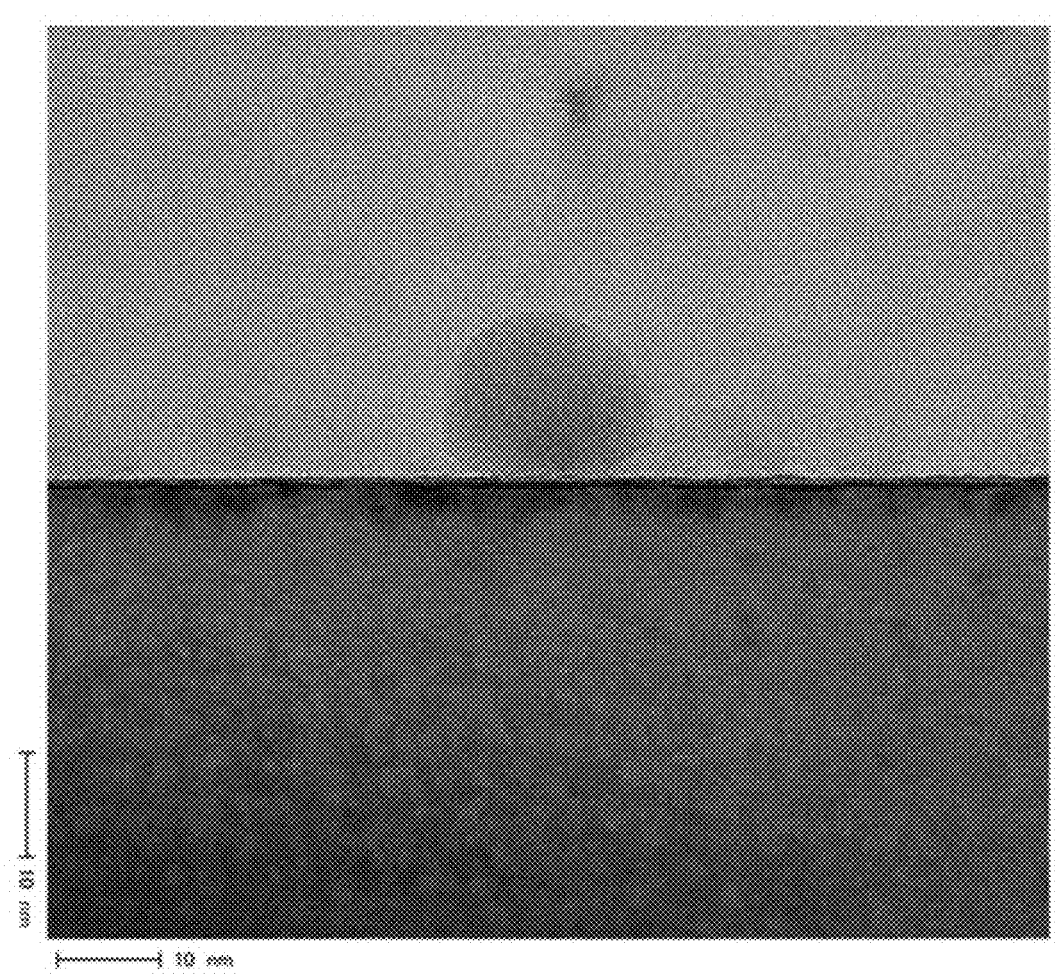
FIG. 8C is a cross-sectional TEM photograph at a bonding interface of a device according to Comparative Example 2.
Figure 8D:
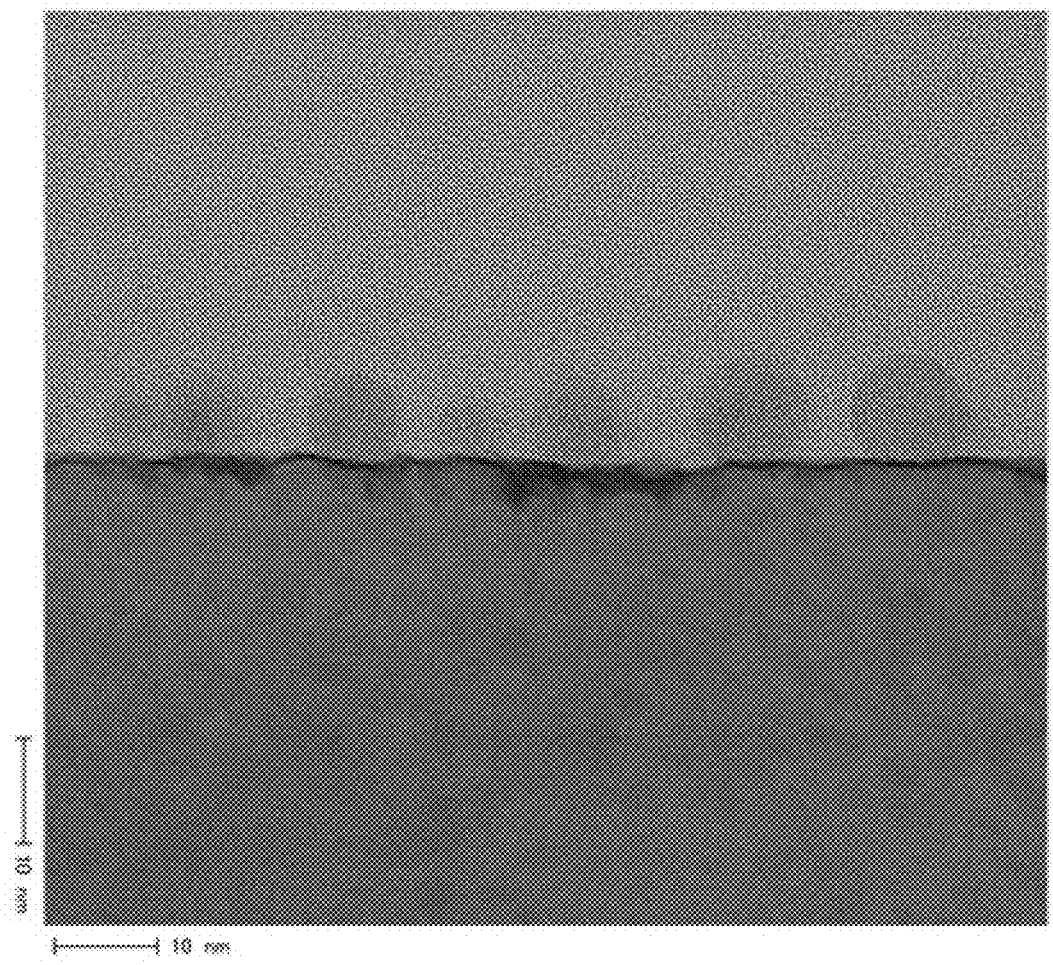
FIG. 8D is a cross-sectional TEM photograph at a bonding interface of a device according to Comparative Example 3.

As a result, as shown in FIG. 7, it was confirmed that the bonding was achieved with less mismatching since atomic arrangement of the second substrate 20 and the atomic arrangement of the first substrate 10 were disturbed only occasionally in the several atomic layers at the interface. Namely, the mismatched portion was 1 nm or less. Great disturbance of atomic arrangement was not found even in the mismatched portion. Thus, the performance of the first substrate 10 can be enhanced despite bonding of different types of materials since unintended strains and stresses induced by strains do not occur in the first substrate 10.

(Presence/Absence of Metal Agglomeration)

Next, cross-sections of the devices of Example 1 and Comparative Examples 1, 2, and 3 after the heat treatment were observed. In particular, a cross-section that included the bonding interface between the first substrate 10 and the second substrate 20 was formed by ion milling and observed with TEM (H-9000NAR produced by Hitachi High-Technologies Corporation) at an acceleration voltage of 200 kV and an observation magnification factor of 2050000 (2 million 50 thousand-fold magnification).

As a result, as illustrated in FIGS. 8A to 8D, agglomeration of metal elements was observed in Comparative Examples 1, 2, and 3 but not in Example 1.

This confirmed that it is important to control the metal density at the bonding interface to $1\times10^{12}$ atoms/cm$^2$ or less for a device that requires a heat treatment for forming semiconductor devices. It was also confirmed that controlling the metal density as such is also important in the case where an oxide layer is formed at the bonding interface.

REFERENCE SIGNS LIST 10 first substrate
20 second substrate

The invention claimed is:
1. A method of manufacturing a device, comprising:
   a step of activating a surface of a first substrate and a surface of a second substrate by using a FAB gun;
   a step of attaching a plurality of metals to the surfaces of the first substrate and the second substrate by sputtering a metal releasing member containing the plurality of metals by using the FAB gun and causing the metal releasing member to release the plurality of metals;
   a step of bonding the first substrate and the second substrate to each other at room temperature by bringing a first surface activated of the first substrate and a second surface activated of the second substrate into contact with each other; and
   a step of performing heating after the bonding of the first substrate and the second substrate, the heating being performed at a temperature higher than an agglomeration start temperature of the plurality of metals and elements constituting the first substrate or the second substrate, wherein, in the step of attaching the plurality of metals, an exposed area of the metal releasing member is adjusted and an existing density of the plurality of metals present at a bonding surface of the first substrate and the second substrate is adjusted to $1 \times 10^{12}$ atoms/cm$^2$ or less.

2. The method of manufacturing a device according to claim 1, wherein, in the activating step, a substrate composed of a single-crystal silicon material is used as the first substrate, the substrate comprising an undoped region in a surface to be irradiated by using the FAB gun, and the method further comprises a step of reducing a thickness of the first substrate to cause the undoped region to remain, the step of reducing a thickness being performed after the bonding step.

3. The method of manufacturing a device according to claim 2, wherein, in the activating step, the first substrate and the second substrate are arranged with a gap between the surfaces and a shielding plate composed of an insulator is disposed between the first substrate and the second substrate.

4. The method of manufacturing a device according to claim 3, wherein, in the activating step, the shielding plate is composed of a material that contains the same element as an element which is a main component of the first substrate or the second substrate.

5. The method of manufacturing a device according to claim 4, wherein, in the activating step, a silicon substrate is used as the first substrate and the shielding plate is composed of a material containing silicon oxide as a main component.

6. The method of manufacturing a device according to claim 4, wherein, in the activating step, a sapphire substrate is used as the second substrate and the shielding plate is composed of a material containing alumina as a main component.

7. The method of manufacturing a device according to claim 2, wherein, in the activating step, a silicon substrate is used as the first substrate and a sapphire substrate is used as the second substrate; and in the step of attaching the plurality of metals, iron is used as one of the plurality of metals.

8. The method of manufacturing a device according to claim 2, wherein, in the heating step, the heating is performed under such conditions that intermetallic compounds are formed between the plurality of metals and an element which is a main component of the first substrate or the second substrate.

9. The method of manufacturing a device according to claim 2, wherein, in the activating step, a silicon substrate is used as the first substrate, and in the heating step, the heating is performed under such conditions that a portion of the first substrate is thermally oxidized.

10. The method of manufacturing a device according to claim 2, wherein the activating step and the step of attaching the plurality of metals are performed simultaneously.

11. The method of manufacturing a device according to claim 1, wherein the activating step is conducted while arranging the first substrate and the second substrate not to face each other.

* * * * *